United States Patent
Uchida et al.

(10) Patent No.: US 7,232,315 B2
(45) Date of Patent: Jun. 19, 2007

(54) CONNECTION STRUCTURE FOR PRINTED WIRING BOARD

(75) Inventors: Shinji Uchida, Kanagawa (JP); Junya Kajimoto, Kanagawa (JP); Akihito Funakoshi, Kanagawa (JP)

(73) Assignee: J.S.T. Mfg. Co., Ltd., Osaka (JP)

( * ) Notice: Subject to any disclaimer, the term of this patent is extended or adjusted under 35 U.S.C. 154(b) by 0 days.

(21) Appl. No.: 10/554,744

(22) PCT Filed: Apr. 23, 2004

(86) PCT No.: PCT/JP2004/005942

§ 371 (c)(1),
(2), (4) Date: Oct. 28, 2005

(87) PCT Pub. No.: WO2004/098251

PCT Pub. Date: Nov. 11, 2004

(65) Prior Publication Data

US 2006/0286858 A1     Dec. 21, 2006

(30) Foreign Application Priority Data

Apr. 30, 2003   (JP) .............................. 2003-125676

(51) Int. Cl.
*H01R 12/00* (2006.01)
(52) U.S. Cl. ............................ 439/67; 439/55; 439/492
(58) Field of Classification Search .................. 439/67, 439/55, 492
See application file for complete search history.

(56) References Cited

U.S. PATENT DOCUMENTS 4,116,516 A * 9/1978 Griffin .......................... 439/67
4,116,517 A * 9/1978 Selvin et al. .................. 439/67
4,587,596 A * 5/1986 Bunnell ....................... 361/749

(Continued)

FOREIGN PATENT DOCUMENTS

DE          EP 0106990      * 2/1983

(Continued)

OTHER PUBLICATIONS

Internaional Search Report mailed on Jun. 15, 2004.

*Primary Examiner*—Michael C. Zarroli
(74) *Attorney, Agent, or Firm*—Rader, Fishman & Grauer PLLC (57) ABSTRACT

A connection structure for a printed wiring board which enables high density integration is provided. A FCP 2 includes an exposed conductor part 2A including an insulating substrate 22 and a reinforcing plate 24 stacked with this substrate 22 via an elastic member 23. In the exposed conductor part 2A, conductors 21 each having a protrusion 20 formed on a surface is placed on the insulating substrate. The exposed conductor part 2A can be elastically deformed in the thickness direction in which the substrate 22, the reinforcing plate 24 and the like are stacked. A printed wiring board 1 is constructed by stacking an inner layer board 10 and a first outer layer board 11 and a second outer layer board 12 which sandwich this inner layer board 10. A notched groove 10A is formed on the inner layer board 10, and an insertion opening 10B is formed. Through-hole ports 11 which appear on the notched groove 10A side is placed on the first outer layer board. When the FPC 2 is inserted into the insertion opening 10B, the protrusion 20 of the FPC 2 fits with the through-hole port 11A from within insertion opening 10B and presses thereto.

11 Claims, 7 Drawing Sheets

U.S. PATENT DOCUMENTS

| | | | |
|---|---|---|---|
| 5,222,668 A | * | 6/1993 | Frankeny et al. ............ 439/197 |
| 5,482,473 A | * | 1/1996 | Lord et al. ..................... 439/67 |
| 2002/0076953 A1 | * | 6/2002 | Terai ........................... 439/67 |
| 2006/0234521 A1 | * | 10/2006 | Uchida et al. ................. 439/55 |

FOREIGN PATENT DOCUMENTS

| | | |
|---|---|---|
| JP | H05-028066 U | 4/1993 |
| JP | H07-018358 U | 3/1995 |
| JP | H07-022571 U | 4/1995 |
| JP | H07-170076 A | 7/1995 |
| JP | H09-102368 A | 4/1997 |
| JP | 2002-015800 A | 1/2002 |
| JP | 2002-083648 A | 3/2002 |
| JP | 2002-158055 A | 5/2002 |

\* cited by examiner

CONNECTION STRUCTURE FOR PRINTED WIRING BOARD

FIELD OF THE INVENTION

The present invention relates to a connection structure for a printed wiring board. More particularly, the present invention relates to a connection structure for a printed wiring board for electrically connecting a printed wiring board called a multilayer printed wiring board, formed by stacking a plurality of substrates, and an FPC (Flexible Printed Circuit).

RELATED ART

Modules of electronic parts and printed wiring boards are mounted in electronic devices. Conventionally, an FPC has been used to connect these printed wiring boards and modules of electronic parts.

Here, a printed wiring board comprises an insulating substrate, a wiring pattern which is formed on this substrate, and circuit elements, such as ICs and connectors, which are connected to the wiring pattern formed on this substrate. ZIF (Zero Insertion Force)-type connectors which can be inserted and removed from FPCs with little force can be cited as connectors comprising the circuit elements mounted on the printed wiring boards (for example, see Japanese Patent Application Laid-open Publication No. 2002-158055).

According to this ZIF-type connector, operability of the FPC and a slider can be improved and connection reliability can be ensured, and miniaturization can be realized as well.

Incidentally, the miniaturization of electronic devices such as mobile phones and mobile devices has been progressing in recent years, and with this miniaturization of electronic devices, the miniaturization and the high integration of FPCs and printed wiring boards are also in demand. Therefore, in order to meet this demand, in recent years, multilayer printed wiring boards formed by stacking a plurality of substrates have come into wide use, in place of double-sided printed boards in which wiring patterns are formed on both sides of the substrate.

However, although the above ZIF-type connector realizes low height, it occupies a certain area on a base plate because it is mounted on a surface of the base plate of the printed wiring board. Therefore, there were instances in which mounting circuit elements with high density was difficult.

In order to solve the above problems, an object of the present invention is to provide a connection structure for printed wiring boards in which circuit elements can be mounted at high density.

SUMMARY OF THE INVENTION

The inventors have invented a connection structure for printed wiring boards for connecting FPCs and printed wiring boards by forming an insertion opening to which a top end portion of the FPC is inserted in the thickness direction of a printed wiring board, in particular, a multilayer printed wiring board, in order to satisfy the above object. More specifically, the present invention provides a connection structure for a printed wiring board such as the following:

(1) A connection structure for a printed wiring board for electrically connecting a FPC and a printed wiring which is electrically connected to this FPC, in which: the FPC includes a board-shaped substrate and has an exposed conductor part which can be elastically deformed in the thickness direction; this exposed conductor part has an exposed surface on a surface of the substrate onto which a plurality of conductors are placed; the conductor includes a protrusion which protrudes from the substrate; the printed wiring board is formed by stacking a plurality of base plates and has an insertion opening into which the FPC is inserted in an edge surface parallel to the stacking direction of the base plates and a plurality of through-hole ports provided on an inner wall surface of the insertion opening; and the protrusion of the FPC is connected to the through-hole port of the insertion opening and pressed thereto when the FPC is inserted into the insertion opening of the printed wiring board.

The present invention can be characterized by "a connection structure for a multilayer printed wiring board in which a FPC and the multilayer printed wiring board are electrically connected by inserting the FPC into a surface parallel to the board thickness of the multilayer printed wiring board, the FPC has an exposed conductor part which can be elastically deformed in the thickness direction, a protrusion which protrudes towards the outer side from a surface of each of a plurality of conductors placed on the exposed conductor part is formed, an insertion opening to which the exposed conductor part of the FPC is inserted is formed on the surface parallel to the board thickness of the multilayer printed board, this insertion opening includes a plurality of through-hole ports in the location where the protrusion of the FPC connects when inserting the FPC, and the protrusion of the FPC connects with the through-hole ports within the insertion opening and is pressed."

In addition, the present invention can be characterized by "the FPC has an exposed conductor part including a plurality of foil-shaped conductors forming an exposed surface exposed toward an outside and each having a protrusion formed on the exposed surface, and an insulating substrate attached closely to a surface of the conductor opposite to the exposed surface, and furthermore, has a stacked structure in which an elastic component is placed between the substrate and a reinforcing plate in the exposed conductor part."

The FPC may be a FFC (Flexible Flat Cable). Low-voltage power supply, grounding wire, signals, differential signals and the like can be supplied to the FPC. Electric signals supplied to the FPC can be connected to the through-hole ports of the printed wiring board via the protrusions formed on the surface of the conductor surface, described hereafter.

As will be described hereafter, the FPC can be formed by sequentially stacking a conductor, a substrate, and a reinforcing plate. The substrate can be formed of insulating material and can, for example, be formed of filmy polyimide board. A part of the laminated body of stacked conductor, substrate and reinforcing plate can be covered with polyimide film or the like.

The exposed conductor part of the FPC is the contact port of the conductor placed on the FPC and is the part wherein the conductor is not covered with insulating material or the like. An elastic material can be placed between the substrate and the reinforcing plate at the exposed conductor part.

The conductor can be formed of material with good conduction and moldability (for example, copper alloy board), and nickel plating can be applied to the conductor after plural conductors are placed on the surface of the substrate and the exposed surface has formed. This nickel plating can be a conductive hard plating.

A protrusion is formed on a surface of the conductor, and one protrusion can be formed for one plate-shaped conductor or, in other words, it can be formed one-on-one with the conductor. This protrusion can be formed beforehand on a board (conductor board) to form the conductor and, after the plate-shaped conductor board is stacked (adhered) onto the substrate, the conductor board is etched and a plurality of conductors may be formed.

The shape of the protrusion can be spherical, pyramid-shaped, or a shape which protrudes with curves other than spherical. These shapes can be obtained by press-molding (deep draw processing) a foil-shaped conductor. The conductor exposed part can be elastically deformed in the thickness direction or, in other words, the direction along the stacked direction of the conductor and substrate and the like, and when the FPC is inserted into the printed wiring board, the protrusion depresses such that the FPC can be inserted.

The printed wiring board according to the present invention is one formed by stacking a plurality of substrates (multilayer printed wiring board) and the conductor is formed on the surface and inside. The plurality of conductors formed on both surfaces and inside of the printed wiring board can be connected in a vertical direction. In other words, by opening a hole in the thickness direction of the printed wiring board (direction in which plural substrates are stacked) and forming conductors on an inner wall surface of this hole or the entire hole space, the plurality of conductors formed on both surfaces and inside of the printed wiring board can be connected in a vertical direction. The steric connection of the printed wiring board can be implemented by the plating through-hole method.

An insertion opening into which the FPC is inserted is provided on an edge surface (surface parallel to the board thickness) in the thickness direction of this printed wiring board. A through-hole port is provided in an inner wall of the insertion opening and enables electrical interconnection of the FPC and the printed wiring board when the FPC is inserted into the insertion opening of the printed wiring board by the protrusion of the conductor of the FPC connecting with the through-hole port and being pressed. Therefore, this through-hole port is a FPC connecting port in this invention.

According to the invention described in (1), because the connection structure for connecting the FPC and the printed wiring board is provided within the printed wiring board, it is possible to mount surface-mount-type electronic components or form pattern wiring on a surface of the printed wiring board, and not only can circuit elements be mounted with high density, but freedom in design can be increased as well.

(2) The connection structure for a printed wiring board according to (1), in which the exposed conductor part of the FPC includes a board-shaped substrate formed from an insulating material and a reinforcing plate which is stacked with this board-shaped substrate with an elastic member sandwiched in between.

In the invention according to (2), the exposed conductor part is formed by stacking the substrate, reinforcing plate, and elastic member which is placed between the substrate and the reinforcing plate. The elastic member can be an adhesive having elasticity which is applied with a predetermined thickness between the substrate and the reinforcing plate in the exposed conductor part. In addition, the elastic member can be an elastomer having a predetermined thickness which is adhered between the substrate and the reinforcing plate in the exposed conductor part.

(3) The connection structure for a printed wiring board according to (1), in which: the exposed conductor part of the FPC includes a board-shaped substrate formed from an insulating material and an elastic reinforcing plate stacked in close contact to this substrate, is bent in the thickness direction, which is the direction in which the substrate and the elastic reinforcing plate are stacked to form a crease perpendicular to this thickness direction; and the conductor is arranged in alignment along this crease.

In the invention according to (3), the exposed conductor part is formed by stacking a plurality of conductors on a surface of the substrate and stacking the elastic reinforcing plate on the surface opposite to the side onto which the conductors are stacked. The exposed conductor part is bent in the thickness direction so that the crease which extends in the direction perpendicular to the thickness direction is formed. The conductor is placed on the surface of the substrate such that the protrusions at the surface are in alignment on the crease.

The elastic reinforcing plate can be a board-shaped member wherein the part corresponding to the exposed conductor part is bent beforehand and, for example, can be a hard synthetic resin board or can also be a metal thin board of which the outer surface is covered with non-conductive material. The substrate is stacked onto the elastic reinforcing plate, the conductor is stacked onto the substrate surface, and this laminated body, as one, forms the bent exposed conductor part. This bent exposed conductor part can be elastically deformed to become flat when pressed.

When the FPC including an exposed conductor part as such is inserted into the insertion opening of the printed wiring board, the protrusion of the conductor comes into contact with the front edge of the insertion opening. When the FPC is further inserted, the exposed conductor part elastically deforms, and the protrusion is relatively depressed. In other words, the bending angle of the exposed conductor part becomes closer to 180°. Then, when the protrusion fits in with the through-hole port, the protrusion presses the through-hole port with the returning force of the elastic reinforcing plate.

(4) A connection structure for a printed wiring board for electrically connecting a FPC and a printed wiring which is electrically connected to this FPC, in which: the FPC has an exposed conductor part having a board-shaped substrate formed from insulating material and a reinforcing plate which is stacked in close contact with this substrate; this exposed conductor part has an exposed surface on a surface of the substrate onto which a plurality of conductors are placed and is inserted into the printed wiring board by contacting an insertion jig closely to the reinforcing plate; the conductor includes a protrusion on a surface which protrudes from the substrate; the insertion jig includes a lead part which is inserted into the printed wiring board and a locking part for locking the FPC; the lead part is formed of elastic material having the same width as the exposed conductor part of the FPC, is bent in the thickness direction which is the direction the substrate and reinforcing plate of the exposed conductor part is stacked to form a crease which extends in the direction perpendicular to the thickness direction; the locking part includes a pair of locking pieces for locking the FPC; the printed wiring board is formed by stacking a plurality of base plates and includes an insertion opening into which the FPC is inserted on an edge surface parallel to the stacking direction of the base plates and a plurality of through-hole ports provided on an inner wall of this insertion opening; and the protrusion of the FPC is connected to the through-hole port of the insertion opening and is pressed thereto when the FPC is inserted into the insertion opening of the printed wiring board.

The invention according to (4) can be characterized by "a connection structure for a multilayer printed wiring board in which a FPC and the multilayer printed wiring board are electrically connected by inserting the FPC into a surface parallel to the board thickness of the multilayer printed wiring board, the FPC has an exposed conductor part including a plurality of foil-shaped conductors forming an exposed surface exposed toward an outside and each having a protrusion formed on the exposed surface, and an insulating substrate which is placed in close contact to a surface of the conductor opposite to the exposed surface, and furthermore has a stacked structure configured by a reinforcing plate placed in close contact with the substrate, an insertion jig comprises a lead part to the multilayer printed wiring board and a locking part with the FPC, the leading part has the same width as the exposed conductor part of the FPC, and an elastic member which is bent such that the plural protrusions and a crease match and the plural protrusions protrude, the locking part comprises a protruding piece for fitting into a pair of grooves which are diagonal in the width direction in the exposed conductor part of the FPC, the multilayer printed wiring board forms an insertion opening into which the exposed conductor part of the FPC is inserted on the board thickness surface of the multilayer printed wiring board, this insertion opening comprises a plurality of through-hole ports in the location in which the protrusion of the FPC connects when inserting the FPC, the FPC is inserted into the insertion opening of the multilayer printed wiring board guided by the insertion jig, and the protrusion of the FPC connects with the through-hole ports from within the insertion opening and is pressed."

In the invention according to (4), the FPC is formed so that the insertion jig is closely adhered to the exposed conductor part and the FPC is inserted into the insertion opening of the printed wiring board. The purpose of this "insertion jig" is to facilitate the insertion of the FPC into the printed wiring board, in combination with the FPC. This insertion jig can, for example, also be called a slider.

The insertion jig can be formed from a synthetic resin board or a metal board having elasticity. The lead part of the insertion jig can be an elastic board bent in the direction perpendicular to the insertion direction and be curved in an arc with a large curvature.

The insertion jig comprises a locking part for locking the FPC. In particular, the locking part comprises a pair of protruding pieces which extend in the direction parallel to the bending direction of the lead part on both side parts in the width direction, and these protruding pieces can be those which are inserted into a pair of rectangular grooves provided on both sides parts in the width direction of the exposed conductor part of the FPC. In addition, a pair of opposing holes can be formed on both sides parts in the width direction of the exposed conductor part of the FPC, a pair of pins can be erected on the locking part of the insertion jig, and the pins can be inserted into the holes.

When the FPC is combined with this insertion jig and is inserted into the insertion opening of the printed wiring board, the protrusion comes into contact with the front edge of the insertion opening. When the FPC is further inserted, the bending angle of the insertion jig becomes closer to 180°, and the protrusion is relatively depressed. Then, when the protrusion fits with the through-hole port, the protrusion presses the through-hole port with the returning force of the insertion jig.

(5) A connection structure for a multilayer printed wiring board according to one of (1) to (4), in which: the printed wiring board includes a first outer layer board, a second outer layer board, and an inner layer board which is placed between the first outer layer board and the second outer layer board; a notched groove into which the exposed conductor part of the FPC is inserted is formed on the inner layer board; the first outer layer board includes a plurality of through-hole ports which penetrate the first outer board, and an insertion opening is formed on an edge surface parallel to the stacked direction in which the first outer layer board, the second outer layer board, and the inner layer board are stacked.

The printed wiring board according to the present invention can be a four-layer board in which the first outer layer board and the second outer board are stacked onto the inner layer board formed of an insulating layer to form an inner layer core. The first outer layer board and the second outer layer board can be formed with use of a double-sided copper-clad laminated sheet with conductor patterns formed by print etching method.

A prepreg and a copper foil can be further stacked on the four-layer board to form a fifth layer, a sixth layer . . . n-layer board as required. Holes can be opened on the printed wiring board to form through-holes, vias, pads-on holes and the like can be formed.

A notched groove is formed on the inner layer board and the insertion opening into which the FPC is inserted can be formed by sandwiching this inner layer board with the first outer layer board and the second outer layer board.

A plurality of through-hole ports which penetrate the first outer layer board and leads to the notched groove is formed in the printed wiring board. The through-hole ports can be arranged in a pattern to correspond with the arrangement of the protrusions formed on the FPC. The through-hole ports do not necessarily have to be arranged in one row in the direction perpendicular to the direction in which the FPC is inserted. It can be arranged appropriately, according to the hole diameter of the through-hole port and the limitations of width of patterns connecting to the through-hole ports.

The width of the notched groove provided in the inner layer board is slightly larger than the width of the exposed conductor part of the FPC, and the notched grooves can be considered to lead, as well as restrict, the FPC in the width direction. By restricting the FPC in this way, the protrusion formed on the FPC and the through-hole port formed on the printed wiring board can be fitted in proper position easily.

The depth of the notched groove can be formed to a degree where it does not interfere with the fitting of the protrusion and the through-hole port. When the tip of the exposed conductor part of the FPC comes into contact with the rear wall of the notched groove, the protrusion and the through-hole port can be fitted and interlocked. In addition, when the protrusion and the through-hole port fit, there can be a space between the tip of the exposed conductor of the FPC and the rear wall of the notched groove.

Although the board thickness of the inner layer board can be 0.2 to 1.6 mm, the thickness of the inner layer board used in practice is presumed to be about 0.6 to 1.0 mm.

The board thickness of the double-sided printed boards which are corresponding to the first outer layer board and the second outer layer board is about 0.2 mm, and the board thickness can be thickened by stacking a prepreg and a copper foil as required or the board thickness of the double-sided board per se can be thickened. The thickness of the copper foil is 35 µm and is a thickness which can be ignored in the thickness direction. In addition, in this invention, the printed wiring boards tacked on both sides of the inner layer board are respectively called as the first outer layer board and the second outer layer board even when the outer layer boards are stacked in multiple.

Although epoxy resin is generally used in the insulating board, the double-sided copper-clad laminated sheet and the prepreg, materials which have heat-resistant characteristics such as BT resin can be used according to purpose, and low dielectric constant materials such as low dielectric constant epoxy resin and polyphenylene ether resin can be used, as well.

(6) The connection structure for a printed wiring board according to one of (1) to (5) in which the protrusions protrude spherically.

(7) The connection structure for a printed wiring board according to one of (1) to (5) in which the protrusions protrude in a pyramid-shape.

(8) The connection structure for a printed wiring board according to or (7) in which the protrusions are aligned in a row.

(9) The connection structure for a printed wiring board according to (5), in which: the printed wiring board is one in which the inner layer board is formed of a insulating plate; the first outer layer board and the second outer layer board are double-sided copper-clad laminating sheets with wire patterns formed; and the inner layer board, the first outer layer board, and the second outer layer board are stacked and connected in a vertical direction in the thickness direction by the solder plating method.

(10) The connection structure for a printed wiring board according to (9), in which: the printed wiring board is one in which a wiring pattern is formed respectively on double-sided copper-clad laminated sheets in the first outer layer board and the second outer layer board; and a prepreg and a copper foil are further stacked between the first outer layer board and the second outer layer board and are connected in a vertical direction in the thickness direction by the solder plating method.

(11) The connection structure for a printed wiring board according to (9) or (10), in which: a plurality of through-hole ports are exposed on the notched groove formed on the printed wiring board, and a plurality of line patterns parallel to the direction in which the FPC is inserted extend from the through-hole ports to an outer edge part of the multilayer printed wiring board in these through-hole ports; and hard plating is applied onto the plurality of line patterns.

The line pattern extending from the through-hole port reduces wear in the inner wall of the printed wiring board due to sliding of the protrusion when the FPC according to the present invention is repeatedly inserted and removed from the printed wiring board. For example, if the printed wiring board is made of a glass epoxy material, its surface is similar to a rough grind stone, but wear of the protrusion is reduced when the FPC is repeatedly inserted and removed from the printed wiring board.

In addition, if gold flash plating is applied after nickel plating on the plurality of the through-hole ports exposed within the insertion opening, this through-hole port becomes a more conductive contact point.

DESCRIPTION OF THE PREFERRED EMBODIMENTS

The embodiments of the present invention are described hereafter, with reference to the drawings. The same reference numbers are affixed to the same members and explanations thereof are omitted or simplified.

Figure 1:
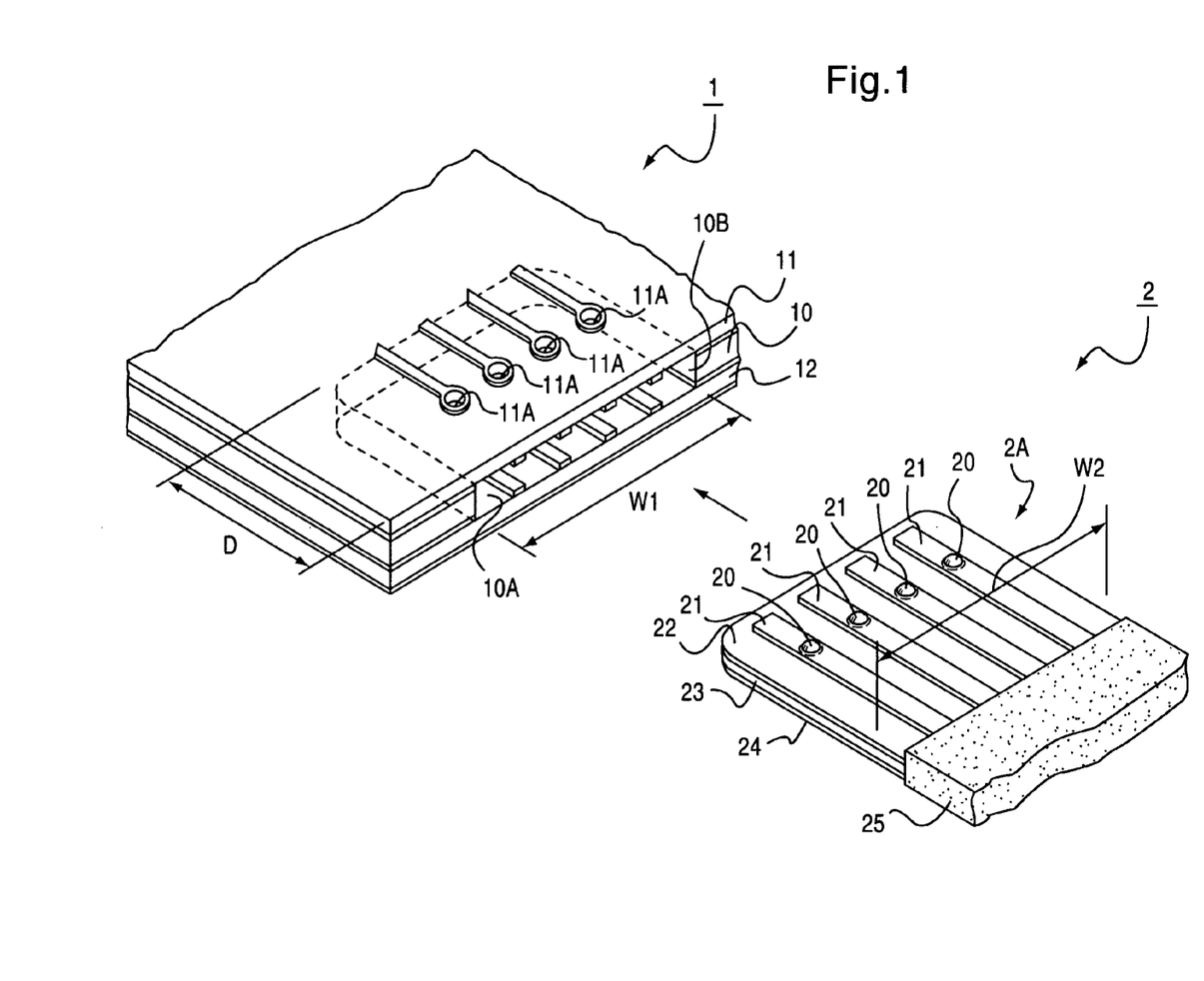
FIG. 1 is a perspective view showing a connection structure for a FPC and a printed wiring board according to a first embodiment of the present invention.

FIG. 1 is a perspective view showing a FPC 2 and a printed wiring board 1 (multilayer printed wiring board, hereinafter abbreviated as multilayer board) according to a first embodiment of the present invention.

The FPC 2 includes a elongated substrate 22, a reinforcing plate 24 which is placed on the lower surface of the substrate 22, and an elastic member 23 which is placed between the substrate 22 and the reinforcing plate 24. An end part near the base end of the FPC 2 is covered with polyimide film 25 and the other end part near the top end is not covered with polyimide film to form an exposed conductor part 2A which is exposed.

The exposed conductor part 2A has a width W2 and has an exposed surface onto which a plurality of conductors 21 extending from the base end side to the top end side of the FPC 2 are arranged. Each of the conductors 21 is adhered onto insulating substrate 22, and a spherical protrusion 20 is formed so as to protrude on a surface of the conductor 21.

The protrusion 20 is formed for each of the conductors 21, in the exposed conductor part 2A of the FPC 2. The protrusions 20 are formed aligned in a row on a plate-shaped conductor board, this plate-shaped conductor board is stacked (adhered) onto the insulating the substrate 22, and the plate-shaped conductor board is etched to cut out the plurality of conductors 21, and then the plurality of the conductors 21 with protrusion 20 are arranged on the substrate 22.

The outer shape of the protrusion 20 can be spherical as shown in FIG. 1 or can be a pyramid-shape. The protrusion 20 can be obtained by, for example, press molding (deep-draw processing) the conductor board. The conductor board can be formed of a material with good conduction and moldability (for example, copper alloy board), and nickel plating can be applied to the plurality of the conductors 21 arranged on the exposed surface after the plurality of the conductors 21 is formed. This nickel plating can be conductive hard plating.

The substrate 22 is formed from an insulating material and, for example, formed of a thin polyimide board. The elastic member 23 is stacked between the substrate 22 and the reinforcing plate 24 by applying elastic adhesive agent onto the exposed conductor part 2A of the FPC 2 with a predetermined thickness. Furthermore, an elastomer can be adhered to the exposed conductor part 2A of the FPC2 with a predetermined thickness as the elastic member 23. The thickness of the elastic member 23 located in the exposed conductor part 2A can be gradually reduced.

On the other hand, the multilayer board 1 has a structure in which a first outer layer board 11, a second outer layer board 12 opposed to this first outer layer board 11, and an inner layer board 10 which is placed between the first outer layer board 11 and the second outer layer board 12 are stacked. The first outer layer board 11 and the second outer layer board 12 are formed of double-sided copper-clad laminated sheets, and conductor patterns are formed on this copper-clad laminated sheet using a print etching method. Furthermore, the inner layer board 10 is formed of an insulating board and this insulating board becomes an inner layer core.

A portion of the inner layer board 10 is notched and a notched groove 10A is formed. The notched groove 10A has a width W1 and a depth D, and the exposed conductor part 2A of the FPC 2 is inserted into the notched groove 10A. A plurality of through-hole ports 11A each having a hole which penetrates the first outer layer board 11 and lead to the notched groove 10A are formed on the first outer layer board 11.

The inner layer board 10 is placed between the first outer layer board 11 and the second outer layer board 12, and the notched groove 10A provided in the inner layer board forms an insertion opening 10B into which the FPC 2 is inserted.

The width W1 of the notched groove 10A is slightly larger than the width W2 of the exposed conductor part 2A of the FPC 2 and guides, as well as restricts, the FPC 2 in the width direction. By restricting the FPC 2 to the width direction in this way, the protrusion 20 formed on the FPC 2 and the through-hole port 11A formed on the multilayer board 1 can be fitted easily.

As shown in FIG. 1, the through-hole ports 11A are arranged in a pattern corresponding to the alignment of the protrusions 20 formed on the FPC 2. The through-hole ports 11A do not necessarily have to be arranged in a row in the direction perpendicular to the direction in which the FPC 2 is inserted. It can be arranged appropriately, according to the hole diameter of the through-hole port 11A and the limitations of width of patterns connecting to the through-hole ports 11A.

Figure 2:
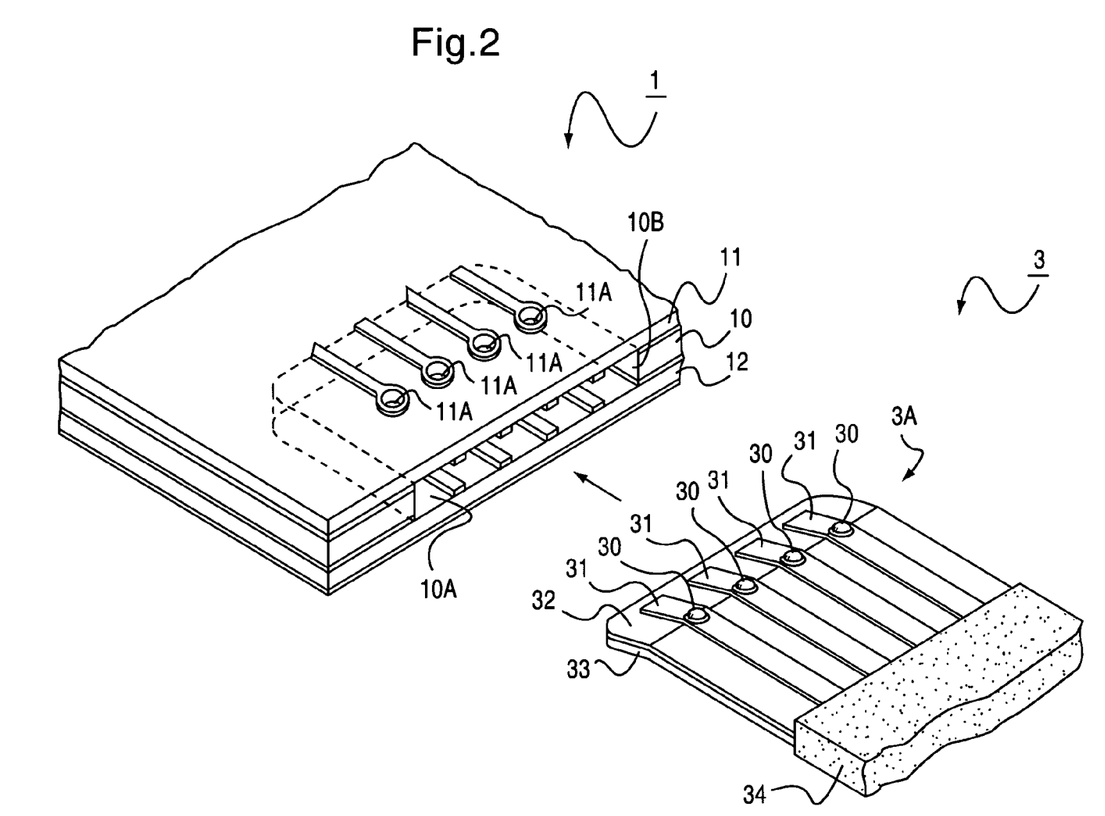
FIG. 2 is a perspective view showing a connection structure for a FPC and a printed wiring board according to a second embodiment of the present invention.

Next, a FPC 3 and a printed wiring board according to a second embodiment of the present invention are described by the perspective view in FIG. 2. In the second embodiment, the printed wiring board (abbreviated to multilayer board) 1 is the same as that in FIG. 1.

In the FPC 3 shown in FIG. 2, a conductor 31 is adhered onto the upper surface of an insulating substrate 32 and an elastic reinforcing plate 33 which has elasticity is adhered onto the lower surface. A portion which is near the top end of the FPC 3 and is not covered with polyimide film 34 forms an exposed conductor part 3A which is exposed. The exposed conductor part 3A is bent along the stacked direction of the conductor 31, the substrate 32 and the elastic reinforcing plate 33, namely in the thickness direction, and forms a crease which extends in the width direction which is the direction perpendicular to this thickness direction.

In addition, a protrusion 30 is formed on a surface of each of the conductors 31. The plurality of the protrusions 30 of the conductors 31 arranged on the substrate 32 are aligned along the top line of the crease. The protrusion 30 is, for example, formed by press-molding (deep draw processing) a conductor board. The conductor board can also be bent to form a crease along the protrusions 30 after the plurality of the protrusions 30 are formed, or the bending process can be performed simultaneously with the formation of the protrusions 30 by composite molding. The conductor board can be etched after stacked (adhered) onto the substrate 32.

The conductors 31 which have protrusions 30 are stacked (adhered) onto the upper surface of the insulating substrate 32, and the elastic reinforcing plate 33 is bent beforehand to comprise a crease and is stacked (adhered) onto the substrate 32 such that the protrusions 30 of the conductors 31 are aligned and protruding along the top line of the crease.

The elastic reinforcing plate 33 can be a hard synthetic resin board or can also be a metal thin board of which the outer surface is covered with non-conductive material. The conductors 31, the substrate 32 and the elastic reinforcing plate 33 can be bent integrally in the exposed conductor part 3A, and this bent exposed conductor part 3A can be elastically deformed so as to become flat when pressed. The substrate 32, the conductors 31 and the protrusions 30 can be constructed from the same materials and in the same method as the substrate 22, the conductors 21 and the protrusions 20 of the FPC 2.

When this FPC 3 is inserted into the insertion opening 10B of the multilayer board 1, the protrusions 30 come into contact with the front edge of the insertion opening 10B. When the FPC 3 is further inserted, the protrusions 30 are relatively depressed. In other words, the bending angle becomes closer to 180°. Then, when the protrusion 30 fits with the through-hole port 11A, the protrusion 30 protrudes slightly and presses the through-hole port 11A with the returning force of the elastic reinforcing plate 33.

Figure 3:
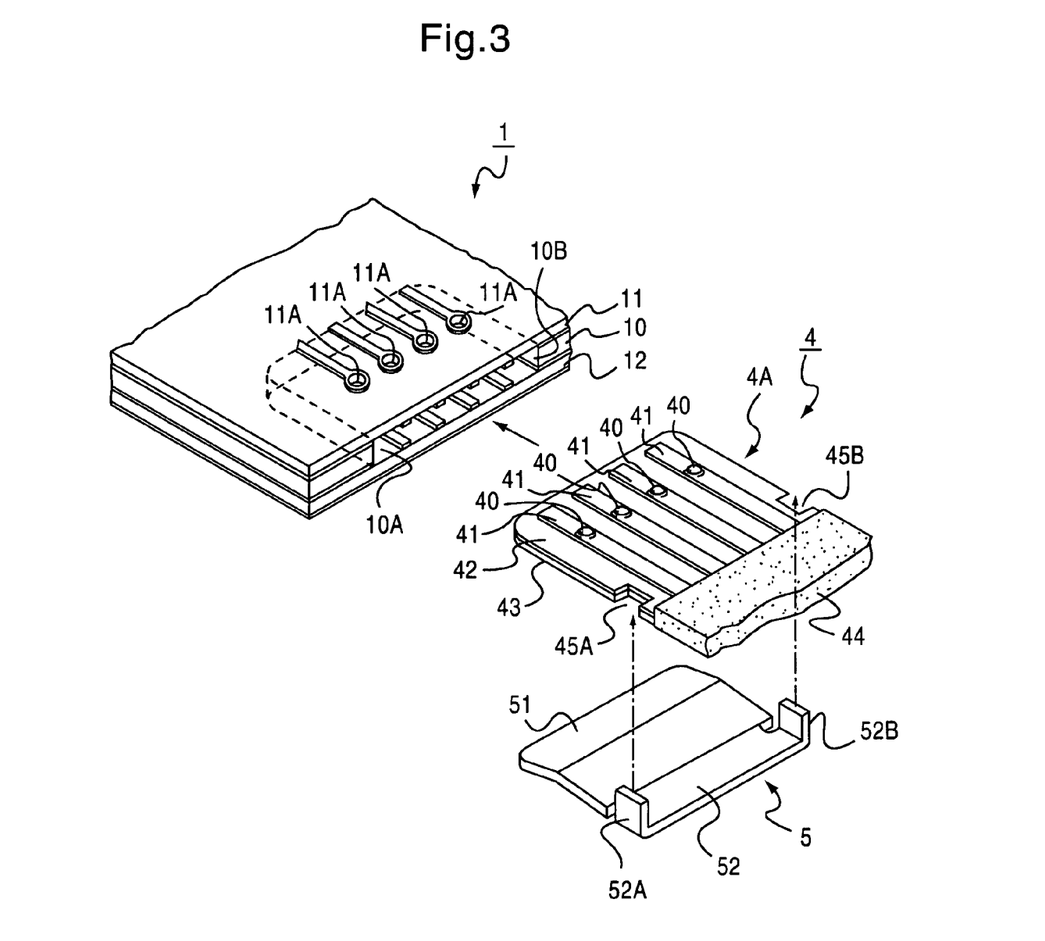
FIG. 3 is a perspective view showing a connection structure for a FPC and a printed wiring board according to a third embodiment of the present invention.

Next, a connection structure for a FPC 4 and a printed wiring board according to a third embodiment of the present invention is described by FIG. 3. In the third embodiment, reference number 5 indicates an insertion jig which is locked onto the FPC 4, and the printed wiring board (abbreviated to multilayer board) 1 is the same as that in FIG. 1.

In the FPC 4 as shown in FIG. 3, a plurality of conductors 41 having protrusions 40 are stacked onto the upper surface of an insulating substrate 42 and a reinforcing plate 43 is adhered to the lower surface. A portion which is near the top end of the FPC 4 and is not covered with polyimide film 44 forms an exposed conductor part 4A which is exposed. The substrate 42 can be constructed using the same materials as the substrate 22 in the FPC 2, and the protrusion 40 and the conductor 41 can also be constructed using the same materials and with the same method as the protrusion 20 and the conductor 21 of the FPC 2. Parts of both side edge parts near the base end of the exposed conductor part 4A are notched, and a pair of grooves 45A and 45B is formed.

The insertion jig 5 comprises a lead part 51 for leading to the multilayer board 1 and a locking part 52 for locking the FPC 4. The insertion jig 5 is an elastic board, and the lead part 51 of the insertion jig 5 is bent in the direction perpendicular to the width direction as shown in FIG. 3. The lard part 51 of the insertion jig 5 can be curved in an arc with a large curvature. The insertion jig 5 can be formed from a synthetic resin board or a metal board having elasticity.

The locking part 52 of the insertion jig 5 comprise a pair of protruding pieces 52A and 52B opposing to each other in the width direction, and these protruding pieces 52A and 52 B are inserted into the rectangular grooves 45A and 45B formed on the exposed conductor part 4A of the FPC 4.

This insertion jig 5 is a slider which is combined with the FPC 4 and facilitates the insertion of the FPC 4 into the multilayer board 1. When the FPC 4 is combined with this insertion jig 5 and is inserted into the insertion opening 10B of the multilayer board 1, the protrusions 40 come into contact with the front surface edge of the insertion opening 10B. When the FPC 4 is further inserted, the protrusions 40 are relatively depressed. In other words, the bending angle of insertion jig 5 becomes closer to 180°. Then, when the protrusion 40 fits with the through-hole port 11A, the protrusion 40 protrudes slightly and presses the through-hole port 11A with the returning force of the insertion jig 5.

Figure 4:
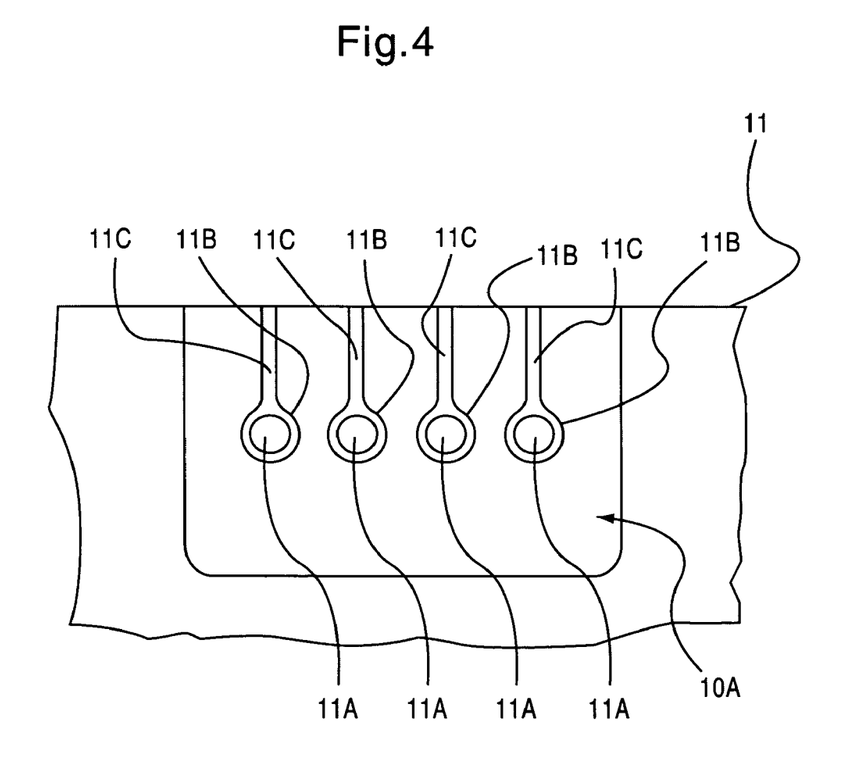
FIG. 4 is a back surface view of a first outer layer board when the first outer layer board of a printed wiring board according to the present invention is viewed from a notched groove-side.

Next, the mechanism of the present invention is described. FIG. 4 is a view of the first outer layer board 11 in FIG. 1 seen from the notched groove 10A side, namely a back surface view of the first outer layer board 11. The through-hole port 11A has a through-hole land 11B and a circular hole formed in the through-hole land 11B. Line patterns 11C extend from the through-hole land 11B towards the outer edge part of the first outer layer board 11.

A plurality of the though-hole ports 11A are placed on the first outer layer board 11, and the through-hole land 11B penetrates the first outer layer board 11 and appears on the notched groove 10A side. When the first outer layer board 11 is stacked with the inner layer board 10, a part of the first outer layer board 11 located in the notched groove 10A forms an inner wall of the insertion opening 10B.

A plurality of the line patterns 11C are arranged in a pattern on the first outer layer board 11 so as to extend along the direction in which a FPC according to the present invention is inserted. Nickel plating or the like is applied on the line patterns 11C. Hard plating other than nickel plating can be applied on the line pattern 11C as well. In addition, if gold flash plating is applied after nickel plating on the plurality of the through-hole lands 11B appearing on the notched groove 10A side, this through-hole land 11B becomes a more conductive contact point.

The line patterns 11C are arranged on the inner wall of the insertion opening 10B in this way such that, for example, wear of the inner wall of the multilayer board 1 (refer to FIG. 1) due to sliding of the protrusion 20 (refer to FIG. 1) is reduced when the FPC according to the present invention is repeatedly inserted and removed from the multilayer board 1.

For example, if the multilayer board 1 is glass epoxy material, its surface is a textured surface similar to a rough grind stone. Therefore, wear of the protrusions 20 (refer to FIG. 1), for example, can be prevented when the FPC is repeatedly inserted and removed from the multilayer board 1, by making the plated line patterns 11C appear on the notched groove 10A side and enabling the protrusions of the conductors of the FPC to be inserted along this line patterns 11C.

Figure 5:
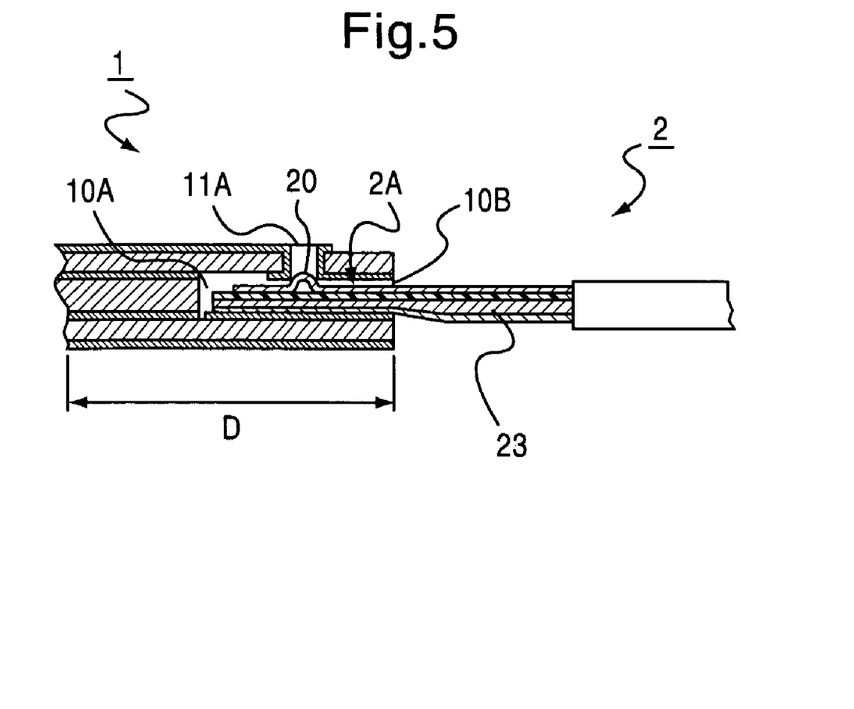
FIG. 5 is a partial cross-sectional view showing a connection state of the FPC and the printed wiring board according to the first embodiment of the present invention.

Next, a connection state of the FPC 2 and the multilayer board 1 according to the first embodiment of the present invention is described by FIG. 5. FIG. 5 is a partial cross-sectional view when cut parallel to the insertion direction of the FPC 2 in a state in which the FPC 2 is inserted into the insertion opening 10B of the multilayer board 1.

As shown in FIG. 5, when the exposed conductor part 2A of the FPC 2 is inserted into the insertion opening 10B of the multilayer board 1, the protrusions 20 come into contact with the front edge of the insertion opening 10B. When the FPC 2 is further inserted, force is applied to the direction in which the protrusions 20 are relatively depressed.

Because the exposed conductor part 2A of the FPC 2 is constructed by stacking the elastic member 23 and can be elastically deformed, the exposed conductor part 2A can be further inserted into the rear of the insertion opening 10B by the elastic member 23 being compressed and deformed. Then, when the exposed conductor part 2A is inserted to a position in which the center of the protrusions 20 and the center of the through-hole ports 11A match, the protrusions 20 rise by the returning force of the elastic member 23 and fit with the through-hole ports 11A. In other words, the elastic member 23 retains elastic force for pressing the protrusions 20 to the through-hole ports 11A.

In addition, although the protrusions 20 and the through-hole ports 11A are formed to be fitted before the tip of the exposed conductor part 2A comes into contact with the rear wall of the notched groove 10A in the present embodiment, as shown in FIG. 5, depth D can be designed such that the protrusions 20 and the through-hole ports 11A are aligned when the tip of the exposed conductor part 2A comes into contact with the rear wall of the notched groove 10A.

Figure 6:
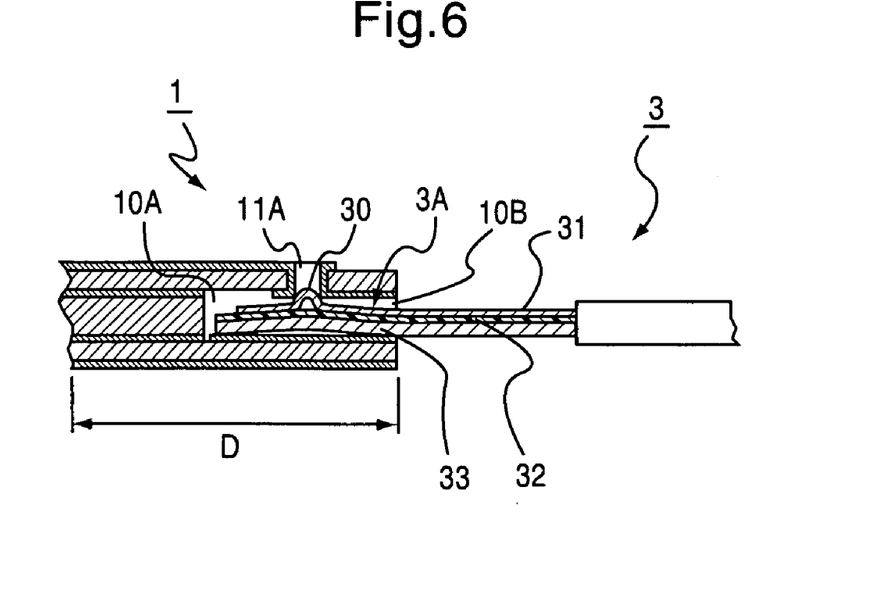
FIG. 6 is a partial cross-sectional view showing a connection state of the FPC and the printed wiring board according to the second embodiment of the present invention.

Next, a connection state of the FPC 3 and the multilayer board 1 according to the second embodiment of the present invention is described by FIG. 6. FIG. 6 is a partial cross-sectional view showing a connection state when the FPC 3, shown in FIG. 2, is used in place of the FPC 2 in FIG. 5.

As shown in FIG. 6, when the exposed conductor part 3A of the FPC 3 is inserted into the insertion opening 10B of the multilayer board 1, the protrusions 30 come into contact with the front edge of the insertion opening 10B. When the FPC3 is further inserted, force is applied in the direction in which the protrusions 30 are relatively depressed.

Because the conductor 31, the substrate 32 and the elastic reinforcing plate 33 of the FPC 3 are bent integrally in the exposed conductor part 3A, this bent exposed conductor part 3A is pressed by the protrusions 30 to become flatter than the initial state before insertion, and the exposed conductor part 3A is inserted further into the rear of the insertion opening 10B.

When the exposed conductor part 3A moves forward to a position in which the center of the protrusions 30 and the center of the through-hole ports 11A match, the protrusions 30 rise by the returning force of the elastic reinforcing plate 33 and fit with the through-hole ports 11A. In this way, the elastic reinforcing plate 33 retains elastic force to press the protrusions 30 to the through-hole ports 11A.

The depth D of the notched groove 10A can be designed such that the protrusions 30 and the through-hole ports 11A are fitted when the tip of the exposed conductor part 3A comes into contact with the rear wall of the notched groove 10A, the same as the connecting of the FPC 2 and the multilayer board 1 shown in FIG. 5.

Figure 7:
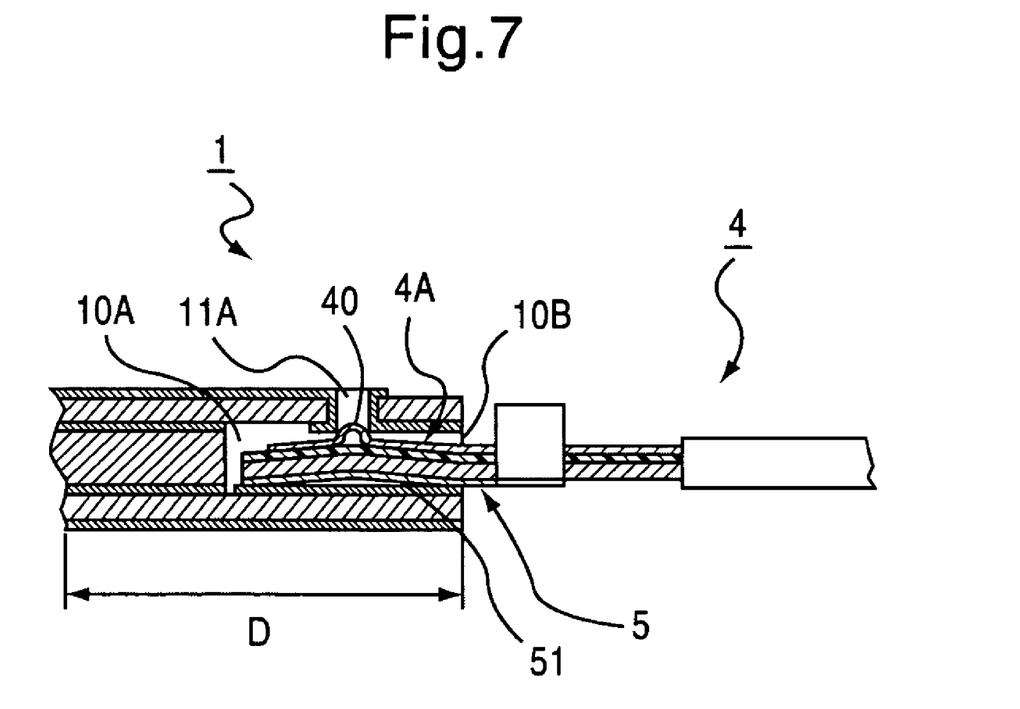
FIG. 7 is a partial cross-sectional view showing a connection state of the FPC and the printed wiring board according to the third embodiment of the present invention.

Next, a connection state of the FPC 4 and the multilayer board 1 according to the third embodiment of the present invention is explained by FIG. 7. FIG. 7 is a partial cross-sectional view showing a connection state of the FPC 4 and the multilayer board 1 when the FPC 4, shown in FIG. 3, is used in place of the FPC 2 in FIG. 5.

If the exposed conductor part 4A of the FPC 4 is combined with the insertion jig 5 and is inserted into the insertion opening 10B of the multilayer board 1 as shown in FIG. 7, the protrusions 40 come into contact with the front edge of the insertion opening 10B. When the FPC 4 is further inserted, a force is applied in the direction in which the protrusions 40 are relatively depressed.

Because the part of lead part 51 of the insertion jig 5 connecting with the exposed conductor part 4A is bent and can be elastically deformed, this bent lead part 51 is pressed by the protrusions 40 to become flatter than the initial state before insertion, and the exposed conductor part 4A and the insertion jig 5 are inserted further into the rear of the insertion opening 10B.

When the exposed conductor part 4A is inserted until a position in which the center of the protrusions 40 and the center of the through-hole ports 11A match, the protrusions 40 rise by the returning force of the lead part 51 and fit with the through-hole ports 11A. In this way, the insertion jig 5 retains elastic force to press the protrusions 40 to the through-hole ports 11A.

In addition, the depth D of the notched groove 10A can be designed such that the protrusions 40 and the through-hole ports 11A are fitted when the tips of the exposed conductor part 4A and the lead part 51 come into contact with the rear wall of the notched groove 10A, the same as connecting the FPC 2 and the multilayer board 1 shown in FIG. 5.

Figure 8:
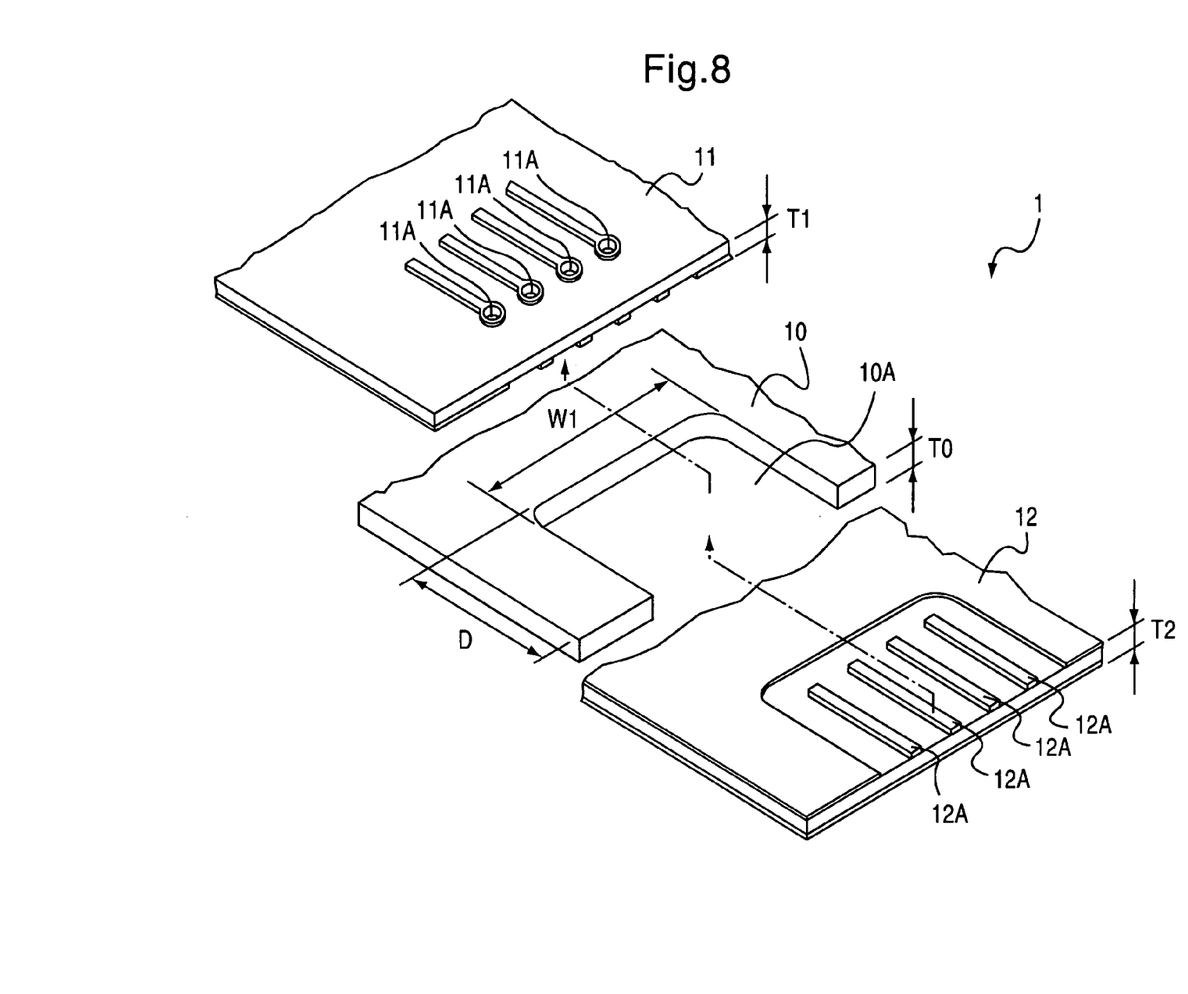
FIG. 8 is a perspective view of a state in which a printed wiring board according to the present invention is disassembled.

Next, the manufacturing method of the multilayer board 1 according to the present invention is described by the perspective view in FIG. 8.

The notched groove 10A is formed beforehand in the inner layer board 10 which becomes the inner layer core. The inner layer board 10 is, for example, an epoxy glass board. The first outer layer board 11 and the second outer layer board 12 is copper-clad laminated sheet having copper foil on both surfaces and conductor patterns formed by the print etching method. Although the copper foil is about 35 µm, the copper foil is drawn exaggerated in the drawings in this specification, including FIG. 8.

Holes are opened on the part of the first outer layer board 11 in which the through-hole ports 11A will be positioned and, the through-hole ports 11A or patterns are formed on both surfaces of the first outer layer board 11 by etching. Next, the through-hole ports 11A are formed.

In the same way, patterns are formed on both surfaces of the second outer layer board 12 by etching. As shown in FIG. 8, the line patterns 12A are formed on a surface of the second outer layer board 12. This line patterns 12 are formed for reducing the contact area with the FPC 2 and reducing frictional resistance when, for example, the FPC 2 shown in FIG. 1 is inserted into the multilayer board 1.

They are stacked in the order of the second outer layer board 12, the inner layer board 10, and the first outer layer board, and are laminated by pressing. Holes are opened in this laminated multilayer board 1 and through holes, via holes, and pads-on-holes are formed, plating process and resist process are performed, and the product is completed.

According to the present invention, a board thickness T0 of the inner layer board 10 can be from 0.2 to 1.6 mm, and the board thickness of the inner layer board used in practice of the present invention is presumed to be about 0.6 to 1.0 mm.

Board thicknesses T1 and T2 of the double-sided printed board configured of the first outer layer board 11 and the second outer layer board 12, respectively, are about 0.2 mm. The board thickness can be thickened by stacking a prepreg and a copper foil as required, and the board thickness of the double-sided printed board can be thickened as well. The thickness of the copper foil is 35 µm and is a thickness which can be ignored in the thickness direction.

According to the present invention, protrusions are formed on a plurality of conductors in the exposed conductor part of the FPC, and an electric body which biases the protrusions is attached to the exposed conductor part of the FPC. An insertion opening into which the FPC is inserted is formed on a surface parallel to the board thickness of the printed wiring board. The insertion opening is formed by notched groove of the inner layer board being sandwiched between the first outer layer board and the second outer layer board, and these boards forms the inner walls of the insertion opening.

When the FPC is inserted into the insertion opening, the protrusion fits with a through-hole port which is a connection port formed within the insertion opening. The protrusion presses against the through-hole port by the bias force of the elastic body.

The connection structure for a printed wiring board such as this contributes to the high density integration of the printed wiring board. In other words, because a connector for a FPC is not mounted onto a surface of the printed wiring board, surface-mounted-type electronic components can be mounted and pattern wiring can be formed on the part in which the connector for the FPC had been conventionally mounted, and freedom of design can be enhanced.

The invention claimed is:

1. A connection structure for a printed wiring board for electrically connecting a FPC and a printed wiring which is electrically connected to this FPC, wherein:
   said FPC comprises a board-shaped substrate and has an exposed conductor part which can be elastically deformed in the thickness direction;
   said exposed conductor part has an exposed surface on a surface of said substrate onto which a plurality of conductors is placed;
   said conductor comprises a protrusion on a surface which protrudes from said substrate;
   said printed wiring board is formed by stacking a plurality of base plates and comprises an insertion opening into which said FPC is inserted in an edge surface parallel to the stacking direction of said base plates and a plurality of through-hole ports provided on an inner wall surface of said insertion opening; and
   said protrusions of said FPC is connected to said through-hole port of said insertion opening and pressed thereto when said FPC is inserted into said insertion opening of said printed wiring board.

2. The connection structure for a printed wiring board according to claim 1, wherein said exposed conductor part of said FPC comprises a board-shaped substrate formed from an insulating material and a reinforcing plate which is stacked with this board-shaped substrate with an elastic member sandwiched in between.

3. The connection structure for a printed wiring board according to claim 1, wherein:
   said exposed conductor part of said FPC comprises a board-shaped substrate formed from an insulating material and an elastic reinforcing plate stacked in close contact to this substrate, is bent in the thickness direction which is the direction in which said substrate and said elastic reinforcing plate are stacked to form a crease perpendicular to this thickness direction; and
   said conductor is arranged in alignment along this crease.

4. A connection structure for a printed wiring board for electrically connecting a FPC and a printed wiring which is electrically connected to this FPC, wherein:
   said FPC has an exposed conductor part comprising a board-shaped substrate formed from insulating material and a reinforcing plate which is stacked in close contact with this substrate;
   said exposed conductor part has an exposed surface on a surface of said substrate onto which a plurality of conductors are placed and is inserted into the printed wiring board by contacting an insertion jig closely to said reinforcing plate and;

said conductor comprises a protrusion on a surface which protrudes from said substrate;

said insertion jig comprises a lead part which is inserted into said printed wiring board and a locking part for locking said FPC;

said lead part is formed from an elastic material having the same width as said exposed conductor part of said FPC, is bent in the thickness direction which is the direction said substrate and said reinforcing plate of said exposed conductor part is stacked to form a crease which extends in the direction perpendicular to the thickness direction;

said locking part comprises a pair of locking pieces for locking said FPC;

said printed wiring board is formed by stacking a plurality of base plates and comprises an insertion opening into which said FPC is inserted on an edge surface parallel to the stacking direction of said baseplates and a plurality of through-hole ports provided on an inner wall of this insertion opening; and said protrusion of said FPC is connected to said through-hole port of said insertion opening and pressed thereto when said FPC is inserted into said insertion opening of said printed wiring board.

5. A connection structure for a printed wiring board according to claim 1, wherein:

said printed wiring board comprises a first outer layer board, a second outer layer board, and an inner layer board which is placed between said first outer layer board and said second outer layer board;

a notched groove into which said exposed conductor part of said FPC is inserted is formed on said inner layer board;

said first outer layer board comprises a plurality of through-hole ports which penetrate said first outer board, and said insertion opening is formed on an edge surface parallel to the stacked direction in which said first outer layer board, said second outer layer board, and inner layer board are stacked.

6. The connection structure for a printed wiring board according to claim 1, wherein:

said protrusions protrude spherically.

7. The connection structure for a printed wiring board according to claim 1, wherein:

said protrusions protrude in a pyramid-shape.

8. The connection structure for a printed wiring board according to claim 6, wherein:

said protrusions are aligned in a row.

9. The connection structure for a printed wiring board according to claim 5, wherein:

said inner layer board is formed in said printed wiring board from insulating plate;

said first outer layer board and said second outer layer board are double-sided copper-clad laminating sheets onto which wire patterns are formed; and said inner layer board, said first outer layer board, and said second outer layer board are stacked and connected sterically in the thickness direction by solder plating method.

10. The connection structure for a printed wiring board according to claim 9, wherein:

a wiring pattern is formed respectively on double-sided copper-clad laminated sheets in said first outer layer board and said second outer layer board in said printed wiring board; and a prepreg and a copper foil are further stacked between said first outer layer board and said second outer layer board and are connected sterically in the thickness direction by solder plating method.

11. The connection structure for a printed wiring board according to claim 9, wherein:

a plurality of through-hole ports are exposed on said notched groove formed on said printed wiring board, and a plurality of line patterns parallel to the direction in which said FPC is inserted extends from said through-hole ports to an outer edge part of said multi-layer printed wiring board, in these through-hole ports; and hard plating is applied onto said plurality of line patterns.

* * * * *